(12) United States Patent
Kato et al.

(10) Patent No.: US 8,525,246 B2
(45) Date of Patent: *Sep. 3, 2013

(54) SEMICONDUCTOR STORAGE DEVICE AND METHOD OF MANUFACTURING THE SAME

(75) Inventors: Yoshiko Kato, Yokohama (JP);
Hiroyuki Kutsukake, Yokohama (JP);
Kikuko Sugimae, Yokohama (JP);
Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 617 days.

This patent is subject to a terminal disclaimer.

(21) Appl. No.: 12/724,802

(22) Filed: Mar. 16, 2010

(65) Prior Publication Data
US 2010/0314677 A1    Dec. 16, 2010

(30) Foreign Application Priority Data
Jun. 16, 2009 (JP) .................................. 2009-143649

(51) Int. Cl.
*H01L 29/76* (2006.01)
(52) U.S. Cl.
USPC ............................. 257/314; 257/315; 257/316
(58) Field of Classification Search
USPC .................................................. 257/314–316
See application file for complete search history.

(56) References Cited

U.S. PATENT DOCUMENTS

| 6,656,800 | B2 | 12/2003 | Arai |
| 8,283,717 | B2 * | 10/2012 | Matsunami et al. .......... 257/315 |
| 2009/0159961 | A1 | 6/2009 | Kato et al. |

FOREIGN PATENT DOCUMENTS

| JP | 9-167832 | 6/1997 |
| JP | 10-247684 | 9/1998 |
| JP | 2006-295191 | 10/2006 |
| JP | 2006-310651 | 11/2006 |
| JP | 2008-166747 | 7/2008 |

OTHER PUBLICATIONS

U.S. Appl. No. 12/886,225, filed Sep. 20, 2010, Matsunami, et al.
Office Action issued on Jun. 25, 2013, in Japanese Patent Application No. 2009-143649 filed Jun. 16, 2009 (with English Translation).

* cited by examiner

*Primary Examiner* — Samuel Gebremariam
(74) *Attorney, Agent, or Firm* — Oblon, Spivak, McClelland, Maier & Neustadt, L.L.P.

(57) ABSTRACT

A non-volatile semiconductor storage device includes: a semiconductor substrate; a semiconductor layer formed on the semiconductor substrate; a first device isolation/insulation film formed in a trench, the trench formed in the semiconductor layer, with a first direction taken as a longitudinal direction; a device formation region formed by separating the semiconductor layer by the first device isolation/insulation film with the first direction taken as a longitudinal direction; and a memory transistor disposed on the device formation region. The first device isolation/insulation film and the device formation region have an impurity of a first conductivity type. An impurity concentration of the impurity of the first conductivity type in the first device isolation/insulation film is higher than that in the device formation region.

12 Claims, 13 Drawing Sheets

US 8,525,246 B2

SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2009-143649, filed on Jun. 16, 2009, the entire contents of which are incorporated herein by reference.

BACKGROUND OF THE INVENTION

1. Field of the Invention

The present invention relates to a semiconductor storage device and a method of manufacturing the same.

2. Description of the Related Art

Recently, semiconductor storage devices such as NAND-type flash memory are implemented on many electronics. As demands for increasing functionality of such electronics grow, the semiconductor storage devices are required to have more storage capacity and more shrinking of storage elements.

Taking NAND-type flash memory as an example, it commonly uses memory transistors with a MOSFET structure having laminated floating and control gates. The NAND-type flash memory includes a NAND cell unit having a plurality of such memory transistors connected in series. Each NAND cell unit has one end connected to a bit line via a selection gate transistor, and the other end connected to a source line via a selection gate transistor.

For the memory and the selection gate transistors with such MOSFET structures, impurities are implanted into the channel parts in order to adjust cut-off characteristics (see, for example, Japanese Patent Laid-Open No. 2008-166747). For the memory transistors of n-type MOSFETs, p-type impurities such as boron (B) are implanted into the channel parts.

So shrinking of devices advances, however, a problem arises that may cause difficulty in ion implantation due to the smaller channel width of selection gate transistors. In addition, variation of the amount of implanted ions in each memory cells is larger.

SUMMARY OF THE INVENTION

One aspect of the present invention provides a semiconductor storage device comprising: a semiconductor substrate; a semiconductor layer formed on the semiconductor substrate; a first device isolation/insulation film formed in a trench, the trench formed in the semiconductor layer with a first direction taken as a longitudinal direction; a device formation region formed by separating the semiconductor layer by the first device isolation/insulation film with the first direction taken as a longitudinal direction; and a memory transistor disposed on the device formation region, the first device isolation/insulation film and the device formation region having an impurity of a first conductivity type, and an impurity concentration of the impurity of the first conductivity type in the first device isolation/insulation film being higher than that in the device formation region.

In addition, another aspect of the present invention provides a method of manufacturing a semiconductor storage device, the method comprising: forming a trench in a semiconductor layer with a first direction taken as a longitudinal direction, and forming a device isolation/insulation film in the trench, thereby separating the semiconductor layer into a plurality of device formation regions by the device isolation/ insulation film; implanting an impurity into the device isolation/insulation film; and diffusing the impurity from the device isolation/insulation film toward the device formation regions through a thermal process.

DETAILED DESCRIPTION OF THE EMBODIMENTS

Embodiments of the present invention will now be described in detail below with reference to the accompanying drawings.

First Embodiment

Figure 1:
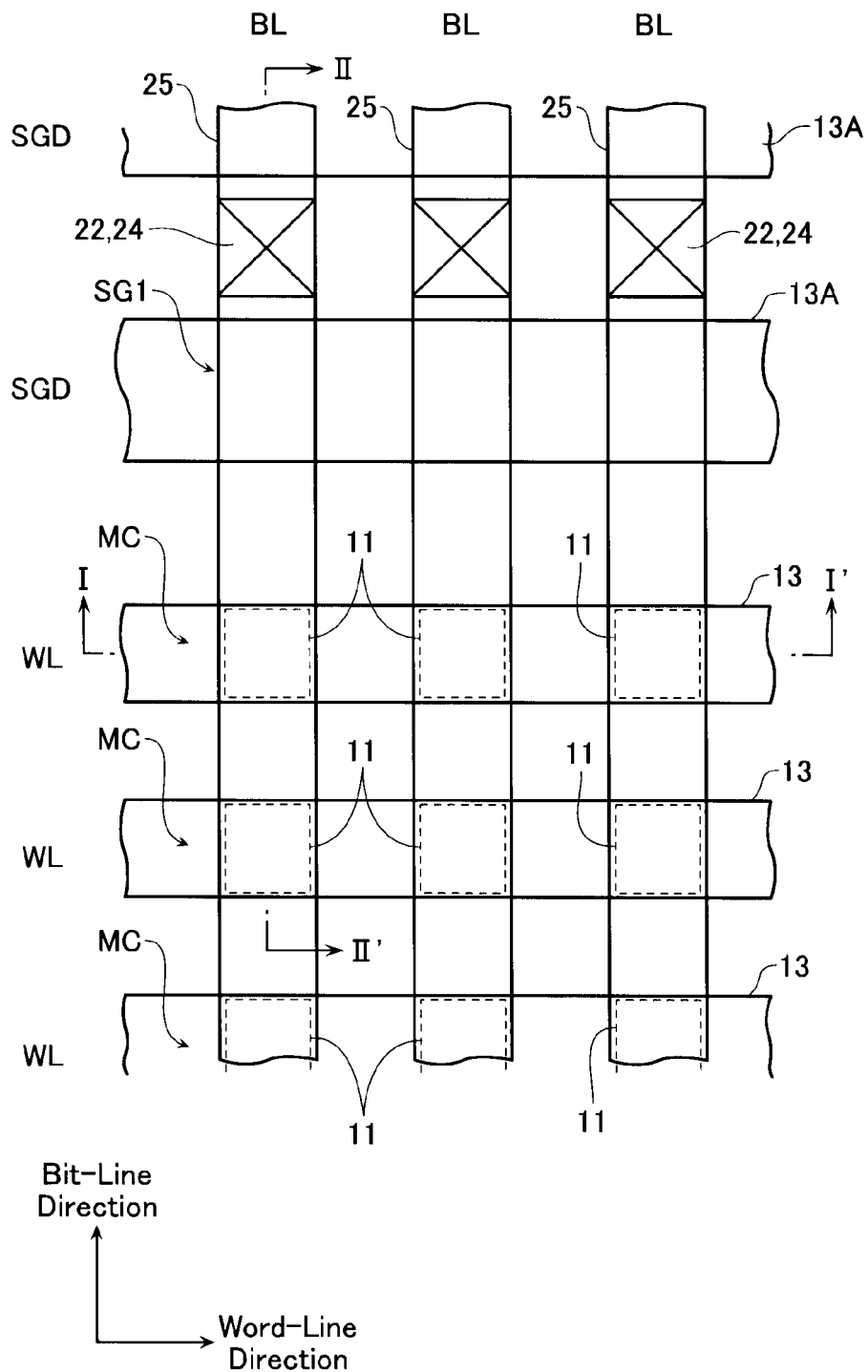
FIG. 1 illustrates a schematic layout (a plan view) of a memory cell array in NAND-type flash memory according to a first embodiment of the present invention.

FIG. 1 illustrates a schematic layout of a memory cell array in NAND-type flash memory according to a first embodiment of the present invention. Word lines (WL) 13 and bit lines (BL) 25 are disposed intersecting one another, and memory cells MC (memory transistors) are formed at respective intersections therebetween. A plurality of memory cells MC that are aligned in the direction in which the bit lines BL extend are connected in series to provide a NAND cell unit, which will be later described. One end of each NAND cell unit is connected to a bit line BL via a selection gate transistor SG1.

Although not illustrated in FIG. 1, the other end of each NAND cell unit is connected to a source line via a selection gate transistor. The gates of selection gate transistors SG1 are disposed continuously as a selection gate line (SGD) 13A parallel to the word lines WL. Wherein, a direction in which the word lines extend represents the word-line direction and another in which the bit lines BL extend represents the bit-line direction. The width between the word lines 13 and the selection gate lines 13A in the bit-line direction is set to be greater than that between the word lines 13.

Figure 2:
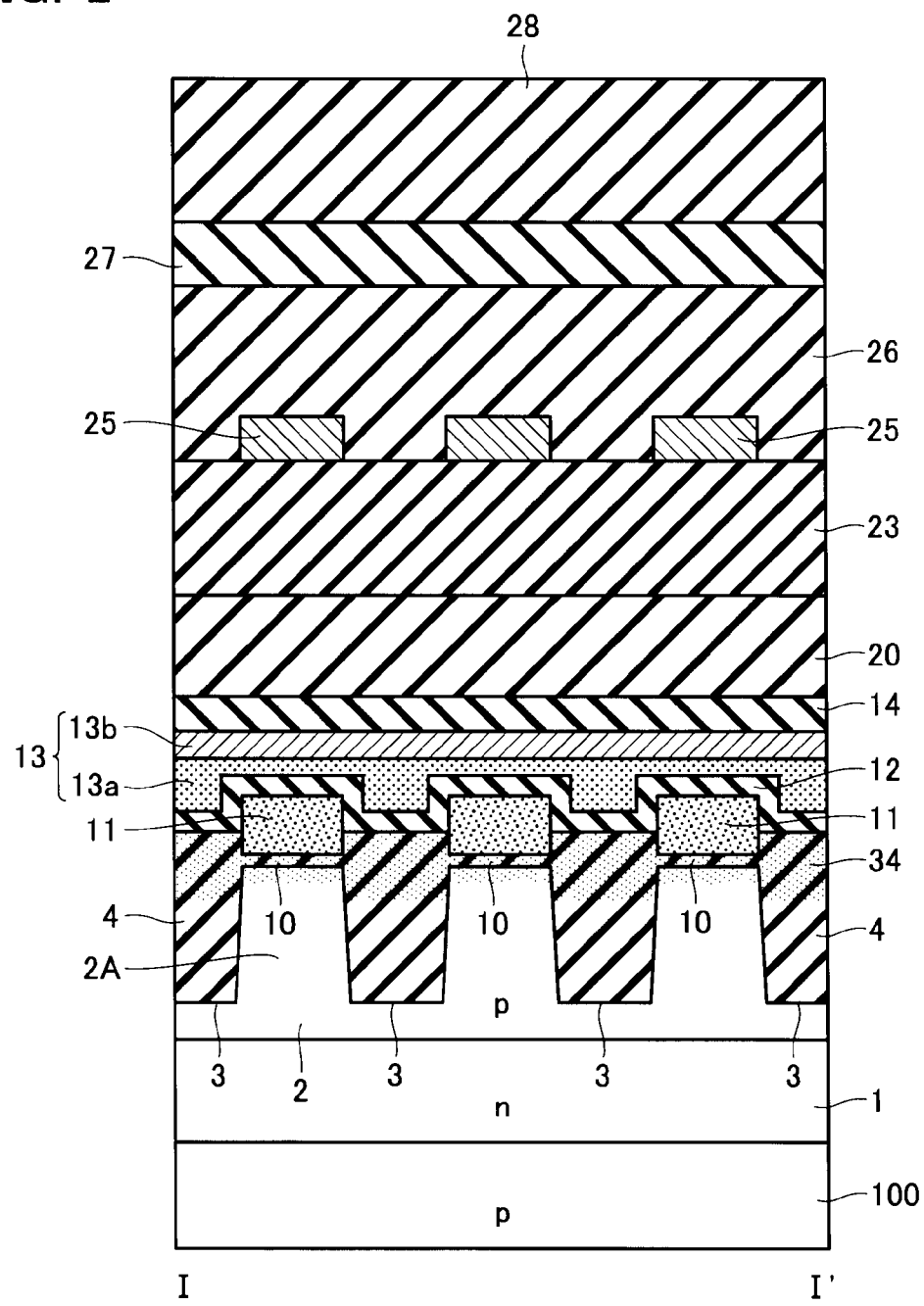
FIG. 2 is a cross-sectional view taken along line I-I' along a word line WL in FIG. 1.
Figure 3:
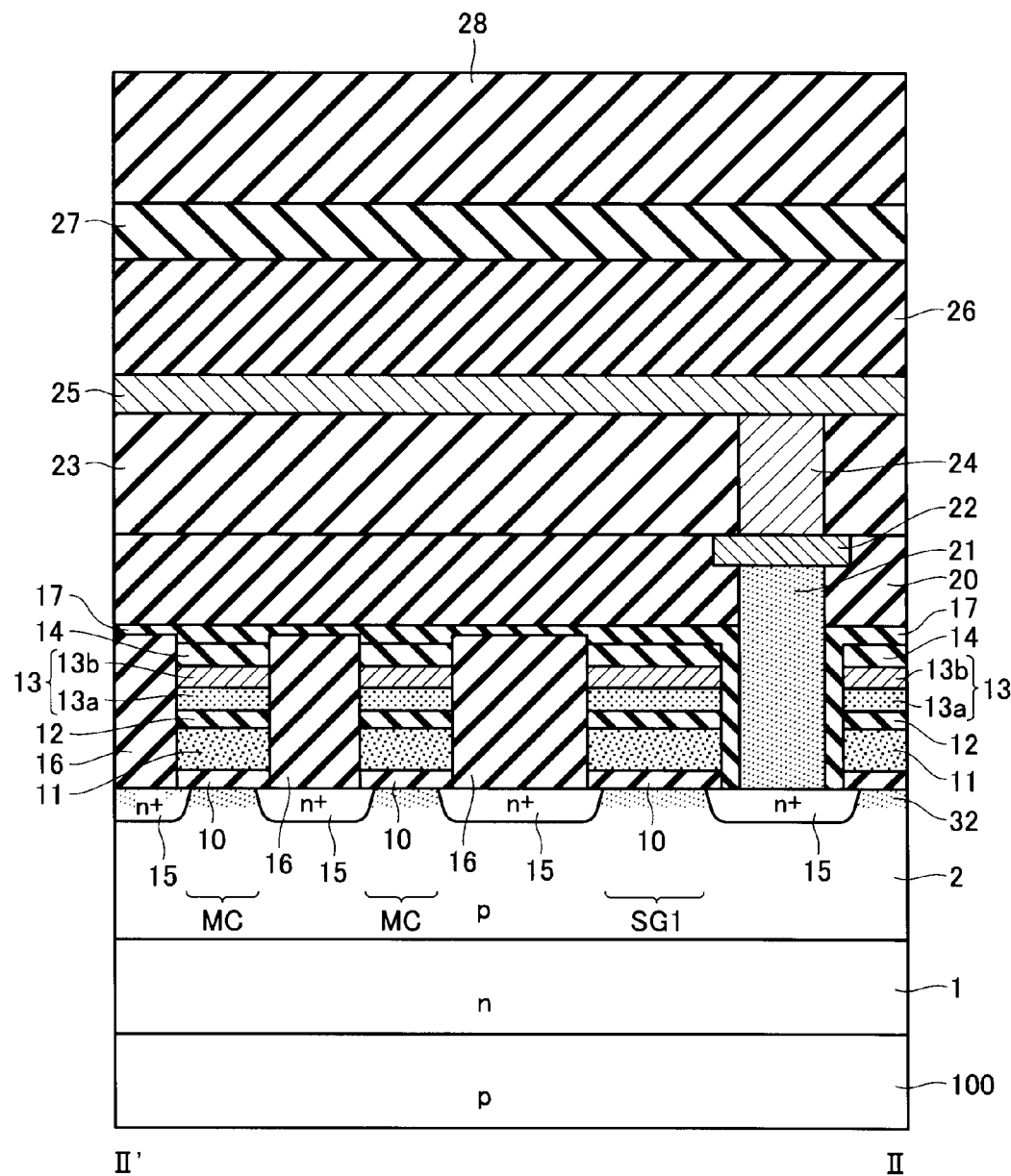
FIG. 3 is a cross-sectional view taken along line II-II' along a bit line BL in FIG. 1.

FIG. 2 is a cross-sectional view taken along line I-I' along a word line WL in FIG. 1; and FIG. 3 is also a cross-sectional view taken along line II-II' along a bit line BL. An n-type well 1 and a p-type well 2 are formed in a cell array area on a p-type silicon substrate 100. The p-type well 2 has trenches 3 formed therein at regular intervals, in which device isolation/insulation films 4 are formed. Memory cells MC are formed at those portions of the p-type well 2 that are sandwiched between the device isolation/insulation films 4. That is, the portions of the p-type well 2 sandwiched between the device isolation/insulation films 4 as device formation regions 2A in which, for example, memory cells MC corresponding to memory transistors are formed. Note that p-type impurities such as boron (B) are implanted into the device isolation/insulation films 4. In addition, boron (B) diffused from the device isolation/insulation films 4 is also provided on the surfaces of the device formation regions 2A. That is, a channel diffusion region 32 is formed continuously from the device isolation/insulation films 4 to the device formation regions 2A. In addition, the impurity concentration of boron is higher in the device isolation/insulation films 4 than in the device formation regions 2A.

Floating gates 11 of polysilicon films are formed on the device formation regions 2A via tunnel oxide films 10. A control gate 13 is formed on the floating gates 11 via an intergate insulation film 12 (e.g., an ONO film). Each control gate 13 is formed by a lamination film including a polysilicon film 13a and a silicide film 13b. Each control gate 13 is continuously patterned in one direction to provide a word line WL. Note that the intergate insulation film 12 is removed by etching within the area of each selection gate transistor SG1 to set the floating gates 11 and the control gate 13 in short-circuited states.

The control gate 13 and the floating gates 11 are patterned at the same time using a silicon nitride film (SiN film) 14 as a mask, and ion implantation is performed using the patterned gates as masks to form source/drain diffusion layers 15. Each diffusion layer 15 is shared by the adjacent memory cells MC to form a NAND string including a plurality of memory cells MC connected in series. Then, a selection gate transistor is connected to each end of the NAND string, thereby forming a NAND cell unit. In addition, channel diffusion regions 32 are formed between respective diffusion layers 15 on the surface of the p-type silicon substrate 100. Note that the channel diffusion regions 32 may be formed near the upper portions of the diffusion layers 15. An interlayer insulation film 16 is embedded in a planar manner between respective gates of the memory cell arrays so formed, and a SiN film 17 is further deposited so as to cover the memory cell arrays.

The memory cell arrays are overlaid with an interlayer insulation film 20. A contact plug 21 and a wiring 22 of the first layer metal are embedded in the interlayer insulation film 20. Furthermore, an interlayer insulation film 23 is laminated thereon. A contact plug 24 is embedded in the interlayer insulation film 23, and a bit line (BL) 25 is formed thereon. Although FIG. 3 only illustrates the contact part at the bit line side and the wiring 22 provides a relay wiring for the bit line, the source wiring is formed by the same film as the wiring 22 at the source line side.

A silicon oxide film 26 as well as a SiN film 27 and a polyimide film 28 formed by plasma CVD are deposited on the bit line 25 as passivation films.

Referring now to FIGS. 4 to 9, manufacturing steps of the semiconductor storage device according to this embodiment will be described below. FIGS. 4 to 9 each illustrate the shape of the cross-section taken along line I-I' in FIG. 1 during respective steps of the manufacturing process.

Figure 4:
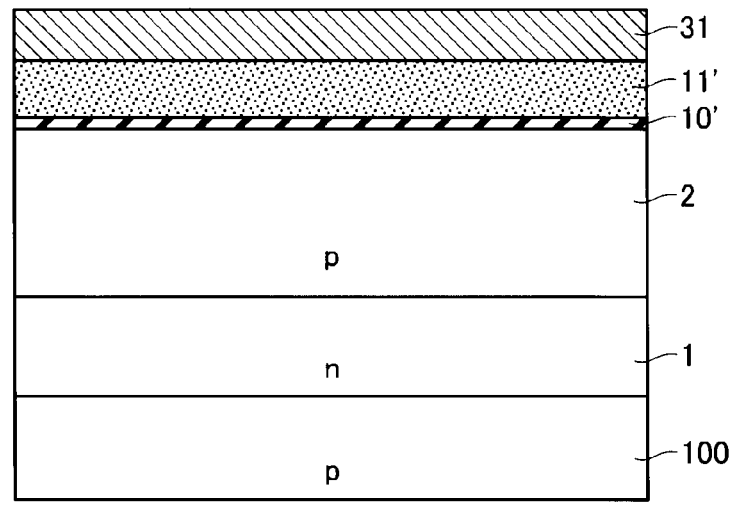
FIG. 4 illustrates a manufacturing step of the NAND-type flash memory according to the first embodiment.

As illustrated in FIG. 4, an n-type well 1 is formed at a region where memory cells MC are formed on the p-type silicon substrate 100, and a p-type well 2 is further formed thereon. Furthermore, an oxide film 10' that provides a tunnel oxide film 10 is formed on the p-type well 2 through thermal oxidation. Subsequently, a conductive film 11' (polysilicon film) that provides a floating gate 11 and an insulation film 31 are sequentially deposited thereon. Note that ion implantation is not performed at this stage for impurity formation at channel parts.

Figure 5:
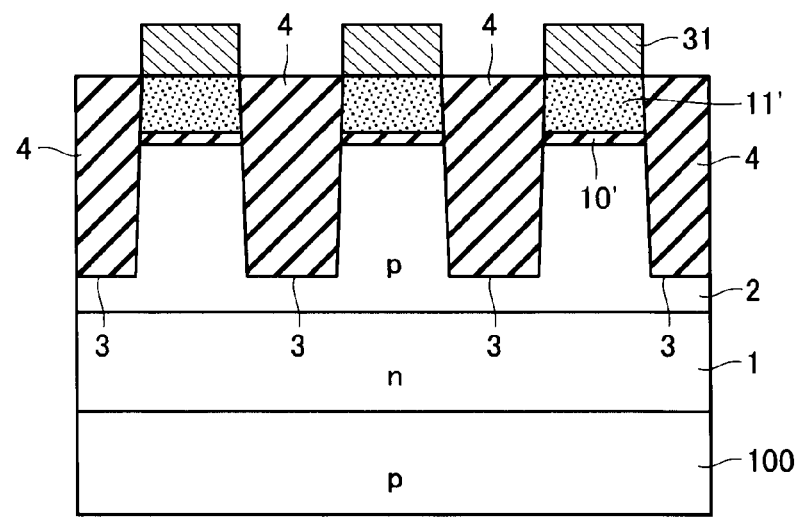
FIG. 5 illustrates a manufacturing step of the NAND-type flash memory according to the first embodiment.

As illustrated in FIG. 5, a resist is formed on the insulation film 31, and patterned except the device isolation/insulation films 4 using photolithography technology. Then, the insulation film 31, the conductive film 11', the oxide film 10', and the p-type silicon substrate 100 are etched by Reactive Ion Etching (RIE) using the patterned resist as a mask. As a result, a plurality of trenches 3 are formed from the surface of the insulation film 31 to reach the p-type well 2 on the p-type silicon substrate 100. Those regions of the p-type well 2 that are sandwiched between the trenches 3 provide the above-mentioned device formation regions 2A. The device formation regions 2A are formed with a vertical direction with respect to the drawing sheets of FIGS. 4 to 9 taken as their longitudinal direction (in other words, the longitudinal direction of the bit lines BL).

The resist is removed by ashing in an oxidizing atmosphere, and then, for example, a TEOS film is deposited on the whole surface of the silicon substrate 100 so as to fill up the trenches 3. The device isolation/insulation films 4 are etching by etch-back process using the insulation films 31 as masks to form device isolation/insulation films 4 only within the trenches 3. At this point, the top surfaces of the device isolation/insulation films 4 are formed at substantially the same level as the top surfaces of the conductive films 11'.

Figure 6A:
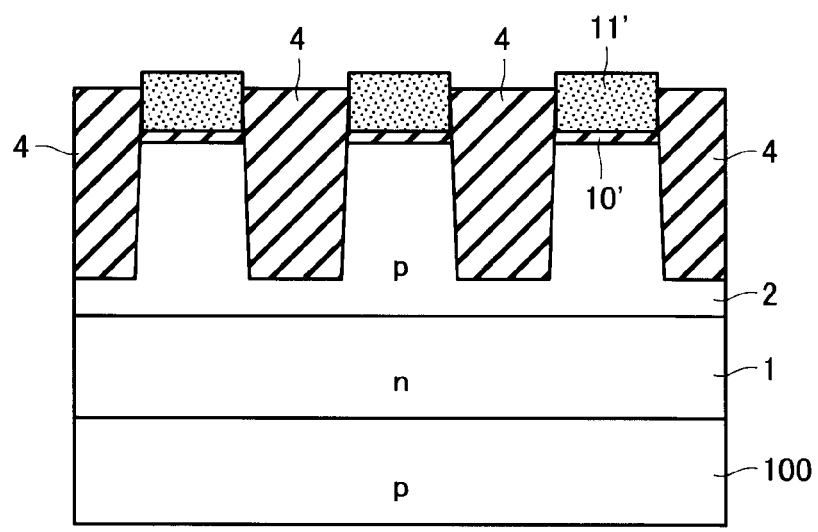
FIG. 6A illustrates a manufacturing step of the NAND-type flash memory according to the first embodiment.
Figure 6B:
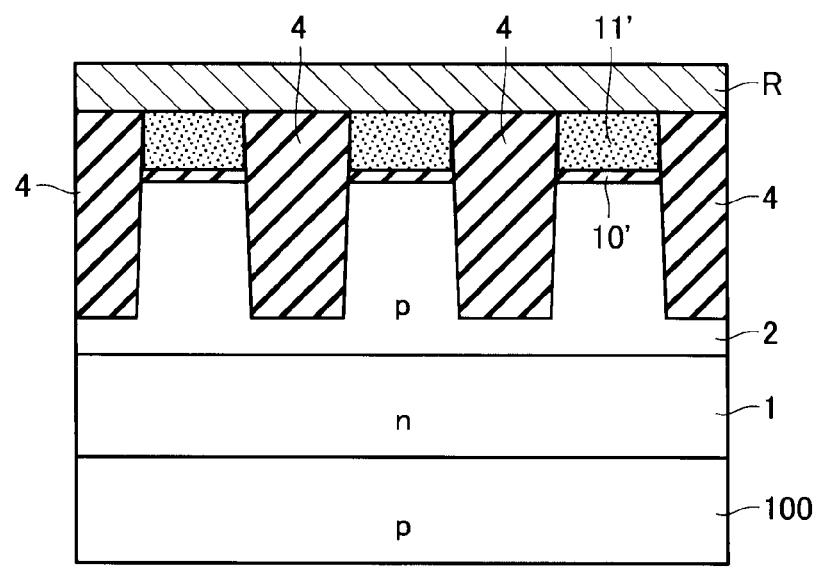
FIG. 6B illustrates a manufacturing step of the NAND-type flash memory according to the first embodiment.

As illustrated in FIG. 6A, after removing of the insulation films 31, the device isolation/insulation films 4 are further etched back with photolithography, RIE, and so on, so that their top surfaces are located below the top surfaces of the conductive films 11'. At this time, as illustrated in FIG. 6B, the peripheral circuit area where peripheral circuits are formed is covered with a resist R (the resist R is an example of a mask material). As a result, the top surfaces of the device isolation/insulation films 4 are formed at substantially the same level as the top surfaces of the conductive films 11' in the peripheral circuit area.

Figure 7A:
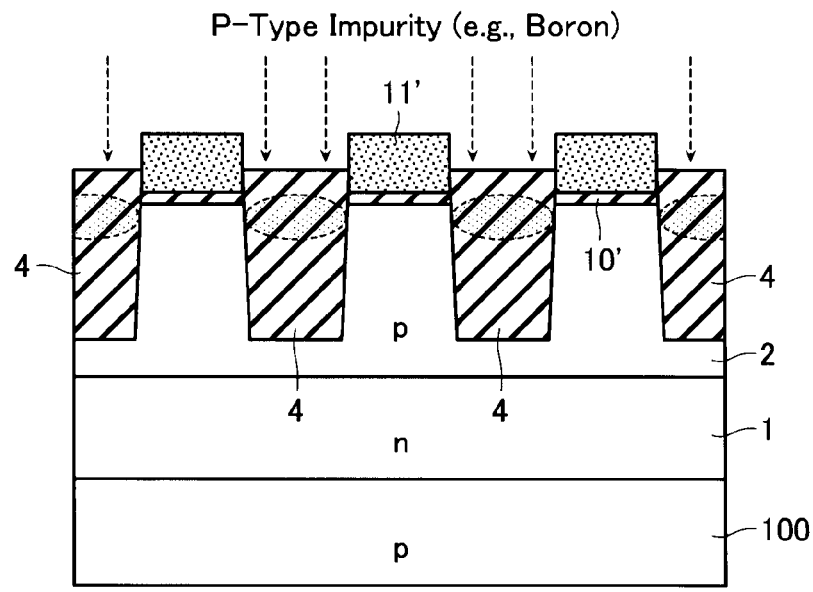
FIG. 7A illustrates a manufacturing step of the NAND-type flash memory according to the first embodiment.

As illustrated in FIG. 7A, p-type impurities (such as boron (B), boron fluoride, boron difluoride, gallium (Ga), or indium (In)) are implanted into the device isolation/insulation films 4 so that the impurity concentration is $10^{11}$ to $10^{13}$ cm$^{-3}$ and the implantation depth is on the order of or not more than 0.1 μm. This implantation is referred to herein as "side-surface diffusion implantation". At this point, the conductive layers 11' function as the masks. The term "mask" used here means that less impurities are implanted into the device formation regions 2A than into the device isolation/insulation films 4. This does not mean that the conductive layers 11' completely prevents the impurities from passing therethrough.

Figure 7B:
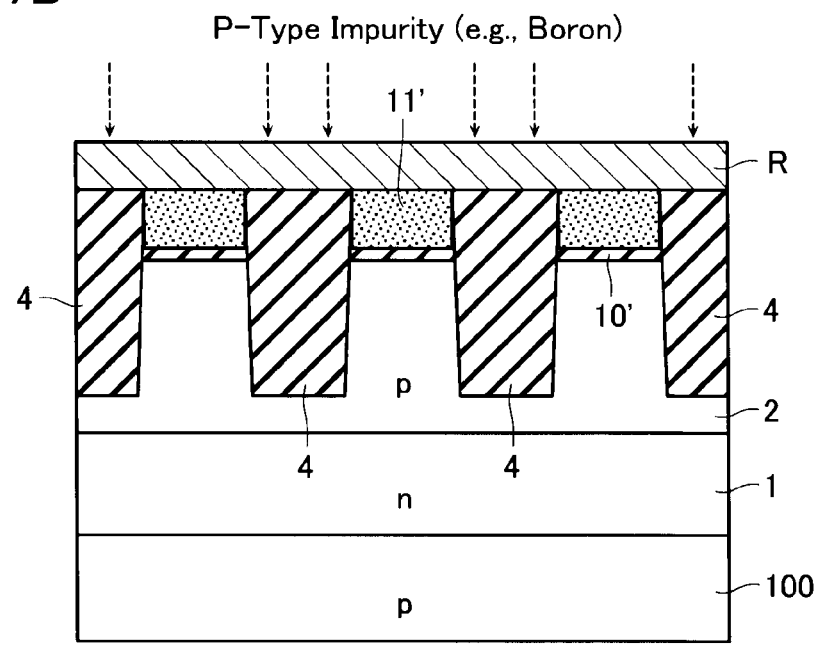
FIG. 7B illustrates a manufacturing step of the NAND-type flash memory according to the first embodiment.

In addition, as illustrated in FIG. 7B, the peripheral circuit area where peripheral circuits are formed is covered with the resist R. Therefore, impurities are not implanted into the device isolation/insulation films 4 in the peripheral circuit area.

The device isolation/insulation films 4 extend in the vertical direction to the drawing sheets of FIGS. 4 to 9, and impurities are uniformly implanted across these regions formed the device isolation/insulation films 4.

In this case, impurities are implanted at an angle such that the diffusion effectively occurs from the device isolation/insulation films 4 to the device formation regions 2A, which will be later described. At this moment, the device isolation/insulation films 4 have stripe-patterned openings in their upper ends from the conductive films 11', and a difference in level between the top surfaces of the conductive films 11' and the top surfaces of the device isolation/insulation films 4 is as small as 10 nm to 30 nm. It is possible to improve a flexibility of an angle of impurity implantation as compared to the conventional art where impurities are implanted from spaces between word lines to the channel parts (the distance between the top surfaces of the word lines and the top surface of the p-type silicon substrate 100 is on the order of about 100 nm). Note that although these impurities are also implanted into the conductive films 11', the conductive films 11' may be little affected by the implanted impurities, as the impurity concentration of the conductive films 11' before the impurity implantation is two orders of magnitude greater than that impurities implanted the device isolation/insulation films 4.

In addition, the side-surface diffusion implantation is performed when the top surfaces of the device isolation/insulation films 4 located below the top surfaces of the conductive layers 11'. It is possible to be implanted to those positions of the device isolation/insulation films 4 deeper than the top surfaces of the device formation regions 2A, while improving function of the conductive layers 11' as masks.

Figure 8:
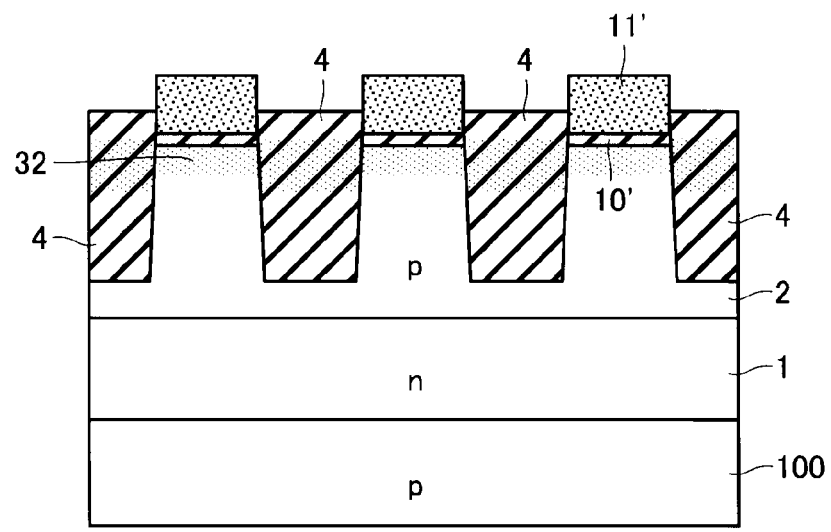
FIG. 8 illustrates a manufacturing step of the NAND-type flash memory according to the first embodiment.

After the resist R is removed from the peripheral circuit area, as illustrated in FIG. 8, a thermal process is performed at 500 to 1100 degrees Celsius. The thermal process causes the p-type impurities implanted into the device isolation/insulation films 4 to be diffused to the p-type well 2 in the device formation regions 2A, thereby forming channel diffusion regions 32. At this point, the p-type impurities are diffused almost uniformly to the device formation region 2A from the device isolation/insulation films 4 that contact with both side surfaces of the device formation region 2A in the word-line direction. As a result, the p-type impurities are diffused from the device isolation/insulation films 4 that are formed on the right and left sides of the device formation region 2A toward a position near the middle of the device formation region 2A. Eventually, the p-type impurities diffused from the right and left sides are connected to each other at the position near the middle of the device formation region 2A. In addition, as the device formation regions 2A and the device isolation/insulation films 4 extend in the bit-line direction, a channel diffusion region 32 is formed across the entire area of the device formation regions 2A in the memory cells MC included in the NAND cell unit.

Figure 9:
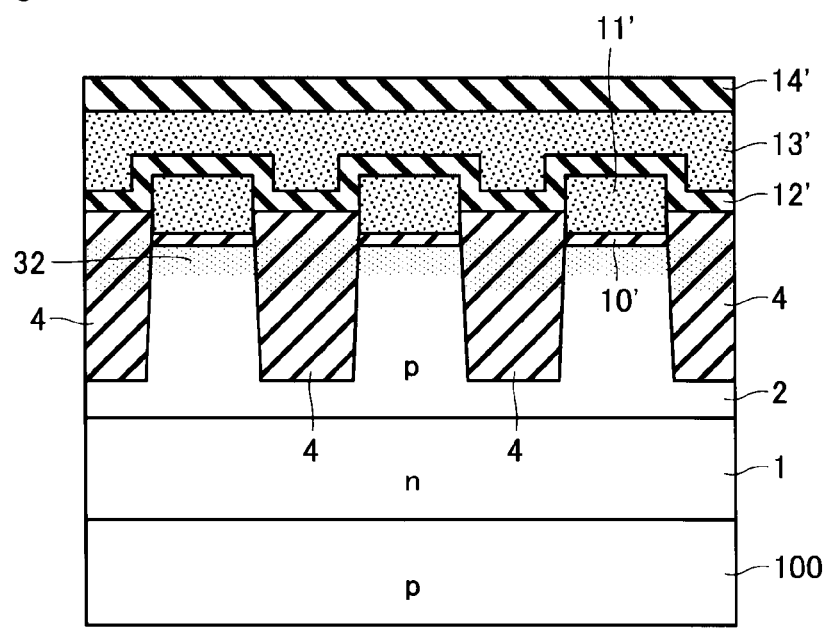
FIG. 9 is illustrates a manufacturing step of the NAND-type flash memory according to the first embodiment.

As illustrated in FIG. 9, an ONO film 12' corresponding to an intergate insulation film 12 is formed on the top surfaces of the conductive layers 11', and a lamination film 13' including a polysilicon film and a silicide film, corresponding to a control gate 13, is further formed thereon. The conductive layers 11', the ONO film 12', and the lamination film 13' are processed to the shapes of word lines WL and selection gate lines SGD. Then, diffusion layers 15 between the memory cells MC, between the memory cell MC and the selection gate transistor SG1, and between selection gate transistors SG1 are formed by ion implantation using the word lines WL and the selection gate lines SGD as masks. The NAND-type flash memory is completed as illustrated in FIGS. 1 to 3 by a well-known method of manufacturing NAND-type flash memory.

Note that in the above-mentioned manufacturing method, the etching step (FIG. 6A) is performed for lowering the level of the top surfaces of the device isolation/insulation films 4 below the top surfaces of the conductive films 11' prior to the implantation of p-type impurities as described above (FIG. 7A). However, the implantation of p-type impurities may be performed prior to the step of FIG. 6A. In that case, in addition to the conductive layers 11', the insulation films 31 used as masks. Accordingly it is possible to improve variations in the memory cell transistor characteristics due to the implantation of impurities into the conductive layers 11'. Furthermore, it is also possible to increase the concentration of implanted impurities because of the reduction in the amount of impurities implanted into the conductive layers 11'. This may result in a higher impurity concentration in the channel diffusion region 32.

Additionally, although the p-type impurities implanted into the device isolation/insulation films 4 are diffused through a thermal process in FIG. 8, for example, the p-type impurities may be diffused by the heat generated during other film formation steps, instead of performing the thermal process specialized for diffusion of the p-type impurities. For example, such diffusion may be caused by thermal processes that are performed in forming an ONO film 12' corresponding to an intergate insulation film 12, or other diffusion layers, e.g., source and drain diffusion layers. Consequently, some of the manufacturing steps may be omitted.

According to this embodiment, p-type impurities are implanted into the device isolation/insulation films 4, and then p-type impurities are diffused toward the device formation regions 2A through thermal diffusion, thereby forming p-type impurity regions on the surfaces of the channel parts. In this case, boron may also be implanted from spaces between word lines WL into the channel parts by using angled ion implantation after the gate electrodes of the memory cells are formed. However, this method is likely to involve variations in the concentration of implanted impurities. This principle will be described in detail below.

Figure 10A:
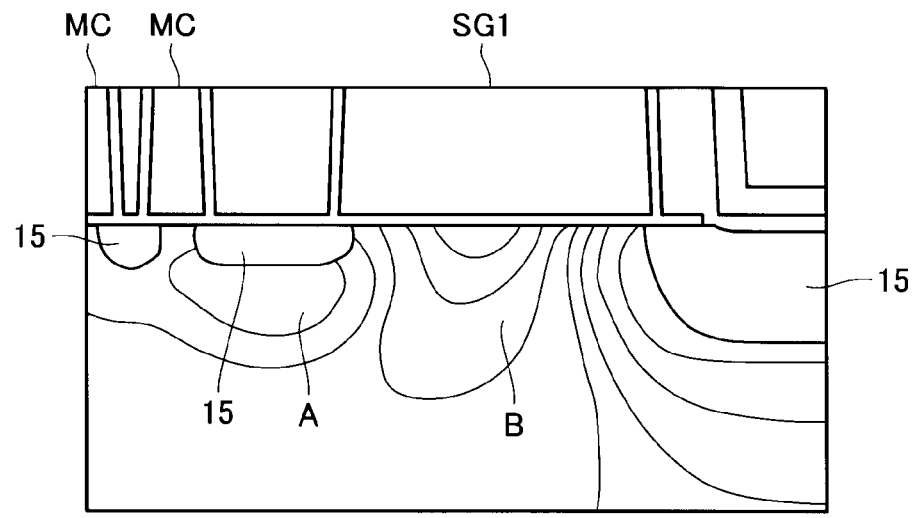
FIG. 10A illustrates the simulation results of impurity concentration distribution when performing channel implantation according to the conventional art.

FIG. 10A illustrates simulation results of impurity concentration distribution when performing channel implantation on the channel parts of memory cells and a selection gate transistor by means of ion implantation from spaces between the word lines WL according to the conventional art. Note that the thick lines in the figure represent boundaries between n-type impurities and p-type impurities, and the thin lines represent respective positions where the same p-type impurity concentration is present.

In this case, a space between the selection gate transistor SG1 and the memory cells MC is set to be greater than those between multiple memory cells MC. Then a higher impurity concentration between the selection gate transistor SG1 and the memory cells MC than those between multiple memory cells MC (as indicated by label "A" of FIG. 10A) in the device formation regions 2A. As a result, the diffusion layer 15 of the memory cells MC adjacent to the selection gate transistor SG1 may be separated from channel of the memory cells MC adjacent to the selection gate transistor due to this high concentration region (label "A"). In addition, a channel part of the selection gate transistor SG1 does not have a constant impurity concentration in the bit-line direction due to another high concentration region (label "B"). That is, the concentration variations of the high concentration region (label "B") result in variations in the selection gate transistor SG1 characteristics.

The variations of the high concentration region (label "B") would be caused by not only variations during the ion implantation, but also by variations in distance between the memory cells MC and the selection gate transistor SG1, as well as variations in thickness of the sidewall insulation films formed on the side surfaces of the selection gate transistor SG1. As a result, the variations in the properties of the selection gate transistor SG1 result in an incorrect read from the memory cells MC.

In addition, if variations in manufacture result in different spaces between memory cells MC, then the channel parts may have different impurity concentrations for different memory cells MC. This could cause variations in the memory cells MC characteristics, which may lead to degradation in reliability. This tendency becomes even more pronounced as the shrinking of the device.

Figure 10B:
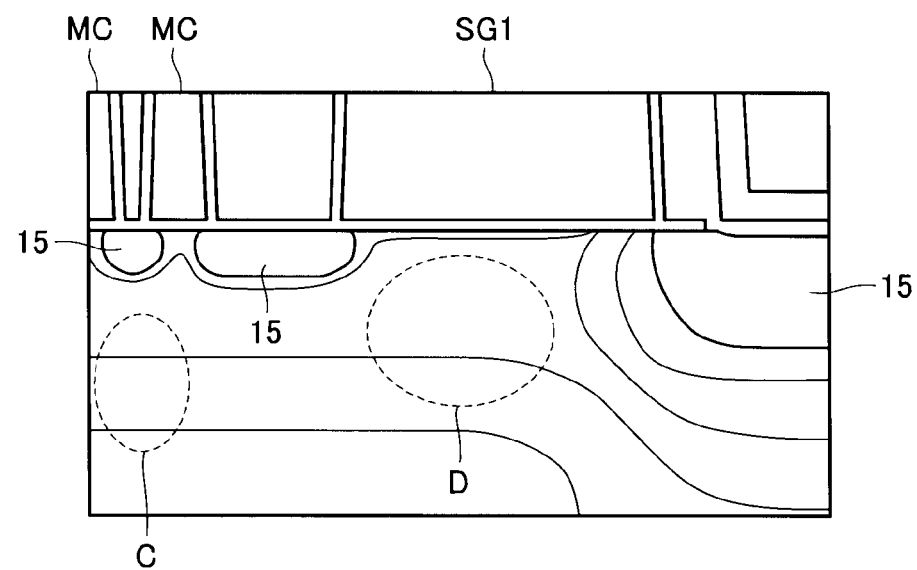
FIG. 10B illustrates the simulation results of impurity concentration distribution when performing impurity implantation according to this embodiment.

On the other hand, FIG. 10B illustrates the impurity concentration distribution when performing channel implantation on the channel parts of memory cells and a selection gate transistor by means of the side-surface diffusion implantation according to this embodiment. In this case, impurity concentration between memory cells MC and that of between the selection gate transistor SG1 and the memory cell MC which has larger than the space between memory cells MC is little difference. Particularly, the impurity concentration is constant in those portions immediately below the channel regions that affect a threshold voltage of the transistors (see labels C and D).

That is, the channel region of the selection gate transistor SG1 also has a substantially uniform impurity concentration distribution in the bit-line direction. In addition, impurity concentration between the channel part of the memory cell MC adjacent to the selection gate transistor SG1 and the channel parts of the other memory cells MC can see little difference. There is a substantially uniform impurity concentration distribution in the bit-line direction (the impurity concentration curves extend in parallel, and at regular intervals, along the bit-line direction at any positions in the channel parts of the plurality of memory cells MC). Thus, according to this embodiment, it is possible to improve the variation in the memory cells MC characteristics, improving the reliability of the memory device.

In addition, when impurities are implanted into the channel parts before formation of the device isolation/insulation films 4, the impurities that are once implanted into the channel regions of the memory cells MC would flow out into the device isolation/insulation films 4 through a thermal process and so on because of the segregation. This causes dilution of the impurity concentration at the side surface of the device formation regions in the word-line direction. Consequently, the impurity concentration distribution changes at the channel parts (i.e., the channel profile is disturbed), which poses a problem that leads to degradation in the cut-off characteristics of memory cells MC and selection gate transistors.

However, this embodiment does not suffer from the problems encountered in the conventional art because the p-type impurities are implanted into the device isolation/insulation films 4, and introduced to the channel regions (device formation regions 2A) of the memory cells MC and selection gate transistors SG by means of diffusion from the device isolation/insulation films 4.

This is because the device isolation/insulation films 4 always involve an impurity concentration higher than that of the device formation regions 2A (including the channel parts of the memory cells MC), according to the diffusion principles. As such, even if the impurity concentration of the channel parts of the memory cells MC is increased, it is possible to reduced the p-type impurities in the device formation regions 2A flowed out of the device formation regions 2A during the subsequent steps of forming device isolation/insulation films as compared to the conventional art significantly.

Note that in this embodiment, a boundary between a memory cell array area where memory cell arrays are formed and a peripheral circuit area where peripheral circuits are formed may be set at an area where the device isolation/insulation films 4 and the device formation regions 2A are set in a periodical manner.

Figure 11:
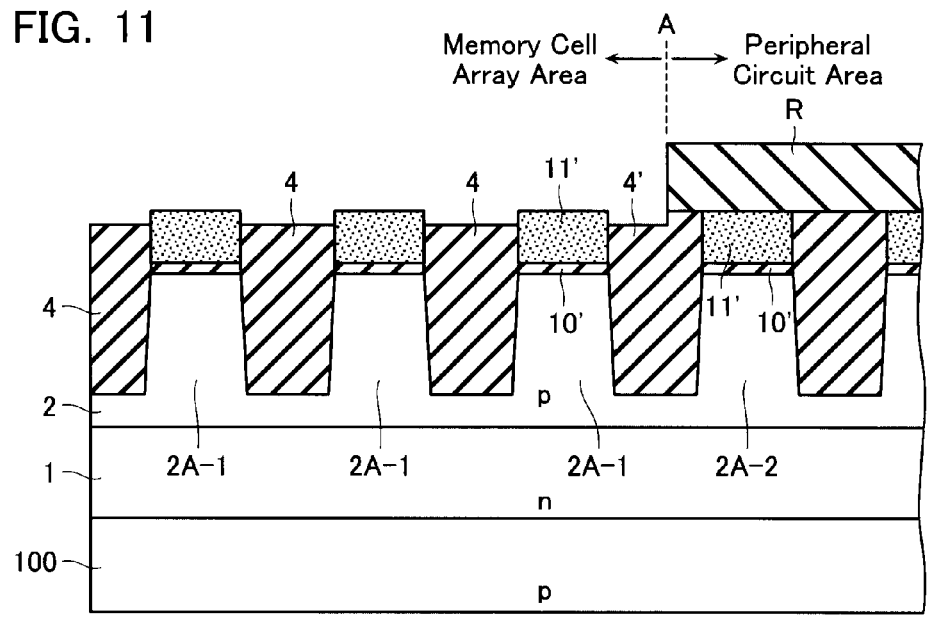
FIG. 11 illustrates an exemplary cross-section near the boundary between a memory cell array area and a peripheral circuit area in the NAND flash memory of this embodiment.

FIG. 11 illustrates a case where a boundary A between the memory cell array area and the peripheral circuit area is set on one device isolation/insulation film 4 (4'). That is, a resist R (the resist R is an example of a mask material) is formed in the area (the peripheral circuit area) located on the right side of the boundary A, and an etch-back step of the device isolation/insulation film 4 (FIGS. 6A, and 6B) is performed using the resist R as a mask. Thus, as illustrated in FIG. 11, the device isolation/insulation film 4' located on the boundary A is etched back as follows: only those portions located on the left side of the boundary A are etched back, while the other portions located on the right side of the boundary A are not.

Thereafter, upon execution of the side-surface diffusion implantation as described in FIGS. 7A, 7B and 8, channel diffusion regions 32 (see FIG. 8) are formed on the device formation regions 2A-1 located on the left side of the device isolation/insulation film 4' through the side-surface diffusion implantation. In contrast, through this side-surface diffusion implantation, channel diffusion region 32 is not formed on a device formation region 2A-2 located on the right side of the device isolation/insulation film 4'. As such, the device formation regions 2A-1 have a higher impurity concentration than the device formation region 2A-2. As described above, the device formation regions 2A-1 have a uniform impurity concentration distribution in the bit-line direction. In addition, the device formation region 2A-2 has a lower impurity concentration than the device formation regions 2A-1 since impurities are not poured into device formation regions 2A-1. It is inferred that the manufacturing method illustrated in FIGS. 4-9 has been performed if the above-described concentration relation exists in the device formation regions.

Figure 12:
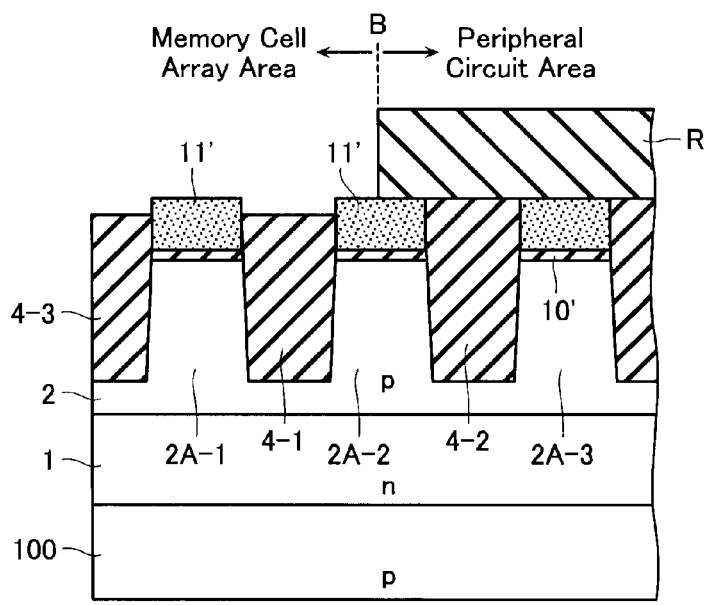
FIG. 12 illustrates another exemplary cross-section near the boundary between a memory cell array area and a peripheral circuit area in the NAND flash memory of this embodiment.

FIG. 12 illustrates a case where a boundary B of the resist R is located at one device formation region 2A (2A-2). In this case, a channel diffusion region 32 is formed on a device formation region 2A-1 located on the left side of the device formation region 2A-2 based on the side-surface diffusion implantation. On the other hand channel diffusion region 32 is not formed on a device formation region 2A-3 on the right side of the device formation region 2A-2 based on the side-surface diffusion implantation. In addition, the side-surface diffusion implantation is performed only on those portions in the device formation region 2A-2 that are located on the left side of the boundary B. Consequently, the device formation region 2A-1 has a higher impurity concentration than the device formation region 2A-3. As described above, a uniform impurity concentration distribution in the bit-line direction is obtained in the device formation region 2A-1, as illustrated in FIG. 10B. Additionally, the left half of the device formation region 2A-2 in the word-line direction has a higher impurity concentration than the right half. It is inferred that the manufacturing method illustrated in FIGS. 4-9 has been performed if the above-described concentration relation exists in the device formation regions.

Second Embodiment

Figure 13:
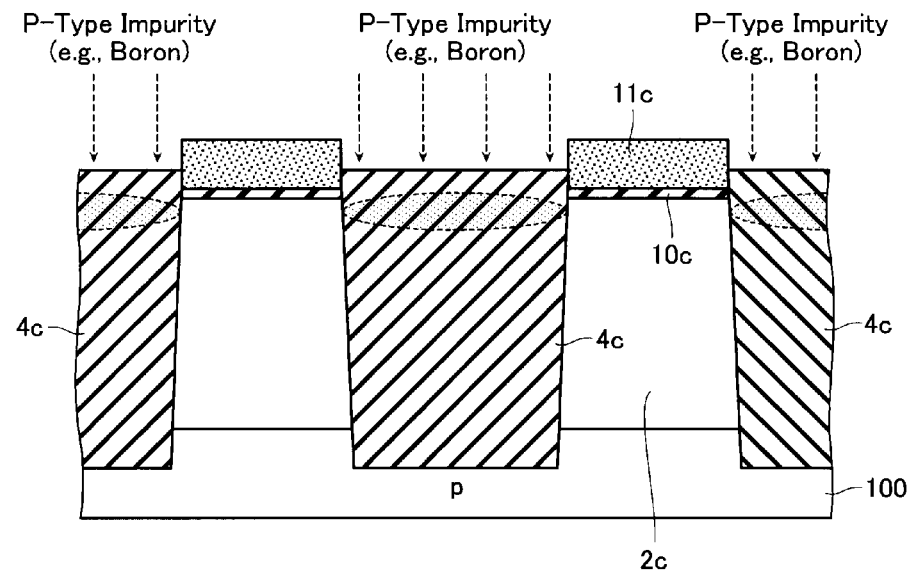
FIG. 13 illustrates a second embodiment of the present invention.
Figure 13:
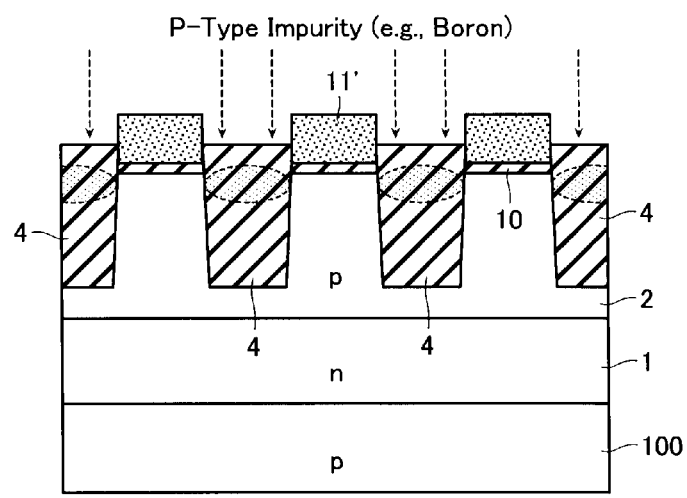
Figure 14:
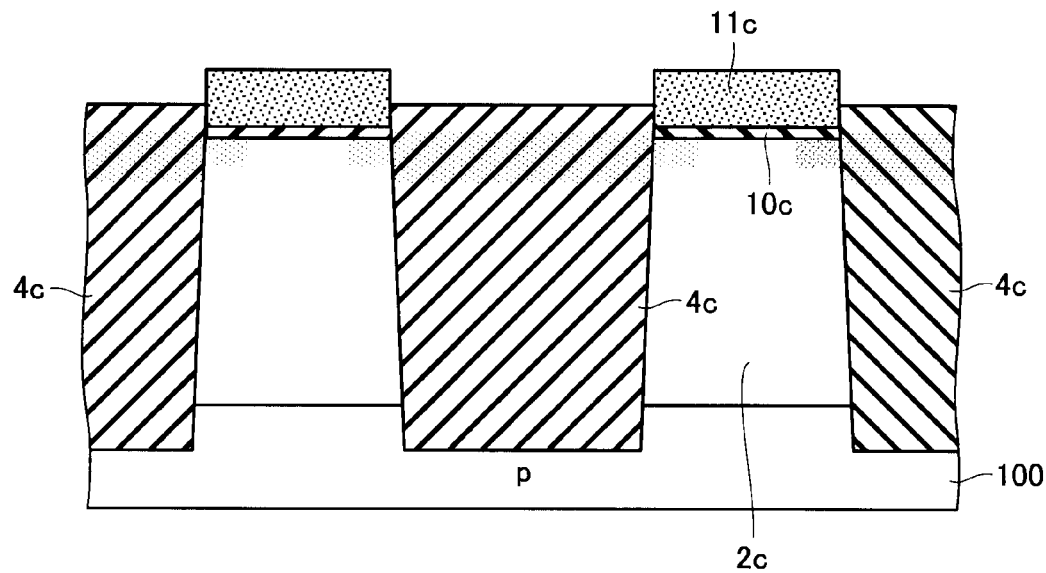
FIG. 14 illustrates the second embodiment of the present invention.
Figure 14:
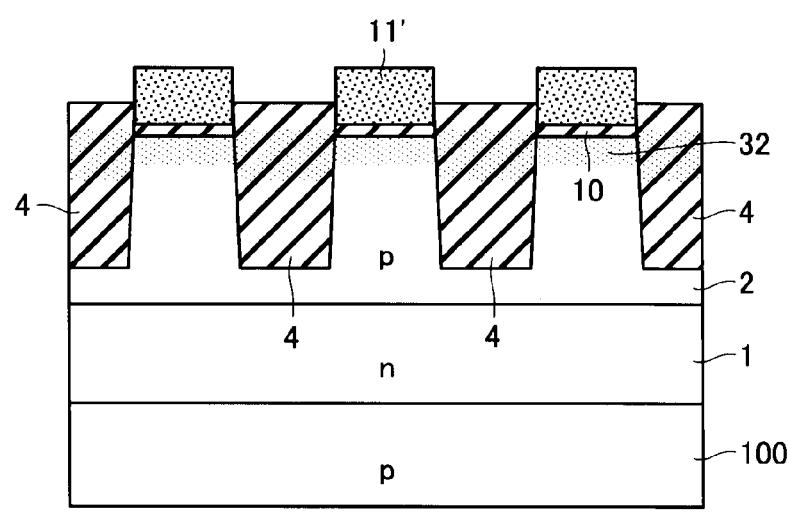

Referring now to FIGS. 13 and 14, a second embodiment of the present invention will be described below. The configuration and manufacturing method of the memory cell array part are the same as those described in the first embodiment (FIGS. 1 to 9), and so not described in detail in this embodiment. This embodiment is only different from the first embodiment in the configuration of low-voltage n-type MOS transistors among the transistors included in the peripheral circuits (such as row decoders) positioned on the periphery of the memory cell array.

As illustrated in FIG. 13, each low-voltage n-type MOS transistor according to this embodiment has a gate electrode 11c that is formed on a p-type well 2c on the p-type silicon substrate 100 via a gate insulation film 10c. In addition, the p-type wells 2c (peripheral device regions) disposed low-voltage n-type MOS transistors are insulated and isolated from one another by device isolation/insulation films 4c. In this case, each gate insulation film 10c has substantially the same film thickness as that of each tunnel insulation film 10.

In addition, the top surface of each device isolation/insulation film 4c is located at a position lower than the top surface of each gate electrode 11c. The position of the top surface of each device isolation/insulation film 4c may be adjusted in a similar way to that described in relation to the device isolation/insulation films 4 in the first embodiment.

In case of the side-surface diffusion implantation should not be performed on other transistors included in the peripheral circuits (such as low-voltage p-type MOS transistors, or high-voltage transistors having gate insulation films with a film thickness greater than that of the gate insulation films 10c). A resist is formed over the surfaces of the other transistors to prevent impurities.

P-type impurities (e.g., boron (B)) are implanted into the device isolation/insulation films 4c as in the device isolation/insulation films 4 in the memory cell array, and then diffused into the p-type wells 2c, including the channel parts of low-voltage n-type MOS transistors, through a thermal process. Again, in the low-voltage n-type MOS transistors, the device isolation/insulation films 4c have a higher p-type impurity concentration than that of the p-type wells 2c. Thus, it is possible to prevent flowing out the p-type impurities that has once been diffused to the p-type wells 2c because of segregation and so on. Therefore, this embodiment may increase the reliability of cut-off characteristics of the low-voltage n-type MOS transistors in the peripheral circuits. Note that the low-voltage n-type MOS transistors included in the peripheral circuits are larger in size than the memory transistors in the memory cell array. Accordingly, although the p-type impurities are diffused in the p-type wells 2c of the low-voltage n-type MOS transistors, they are diffused as illustrated in FIG. 14, not across the entire channel parts, but only to the end portions of the channel parts, i.e., device formation regions in contact with the device isolation/insulation films 4c. Note that the p-type impurities are diffused on the surfaces of the p-type wells 2c that are located below the gate electrodes 11c.

As can be seen, in this embodiment, the p-type impurities are also implanted into the device isolation/insulation films 4c that insulate and isolate the low-voltage n-type MOS transistors in the peripheral circuit area, and then diffused into the channel parts of the low-voltage n-type MOS transistors. Since the top surfaces of the device isolation/insulation films 4c are lowered below the top surfaces of the gate electrodes 11c through the etch-back process, the p-type impurities may be implanted into their channel parts as in the memory cells MC.

In addition, it is possible to increase impurity concentration of the end portions of the channel region that contact the device isolation/insulation films 4c, i.e., the impurity concentration of the channel region below the end portions of the gate electrode 11c in the channel width direction. Consequently, the relevant cut-off characteristics of the low-voltage n-type MOS transistors may be controlled.

Variation of Second Embodiment

Figure 15:
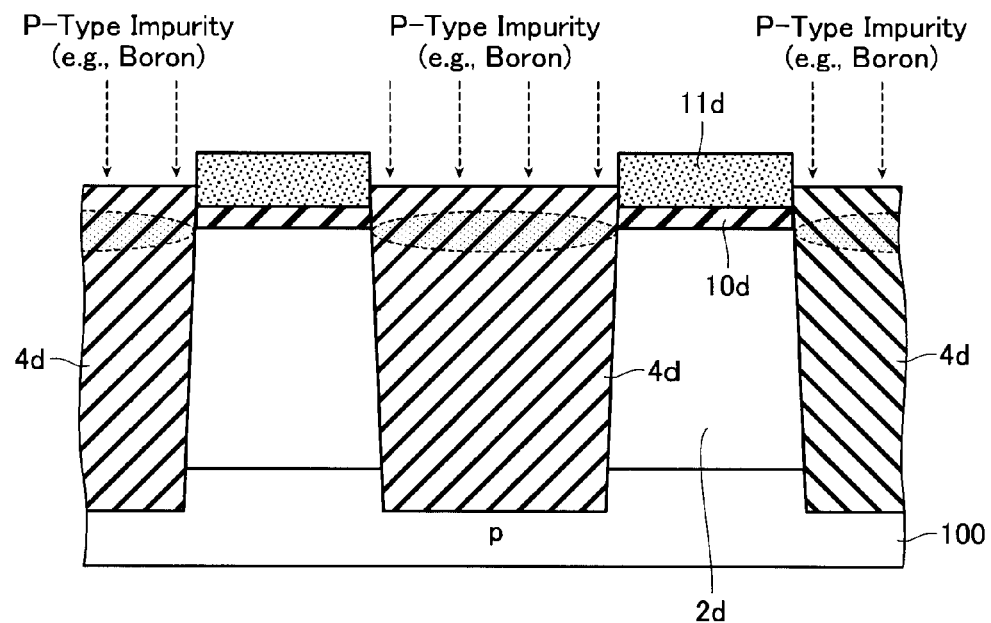
FIG. 15 illustrates a variation of the second embodiment of the present invention.
Figure 15:
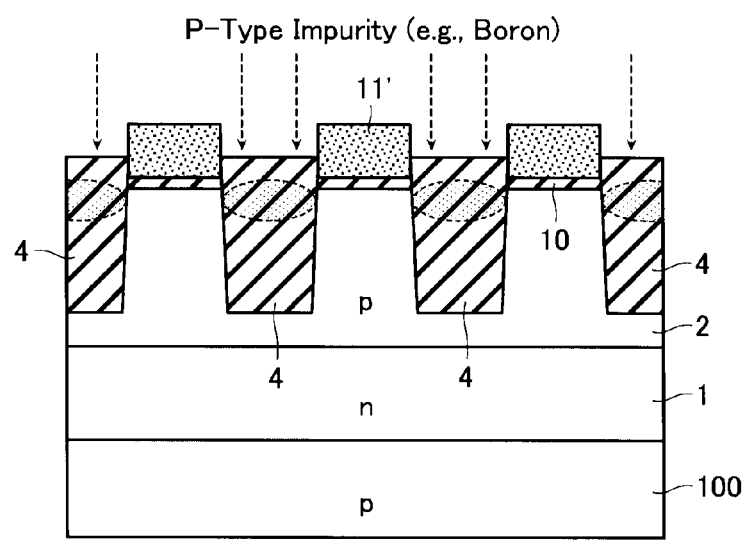
Figure 16:
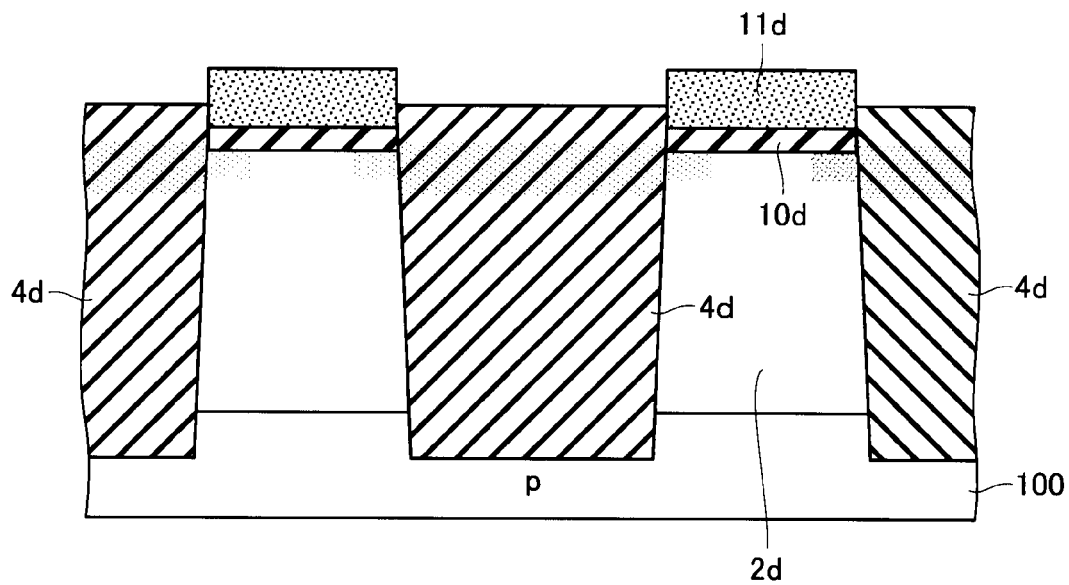
FIG. 16 illustrates a variation of the second embodiment of the present invention.
Figure 16:
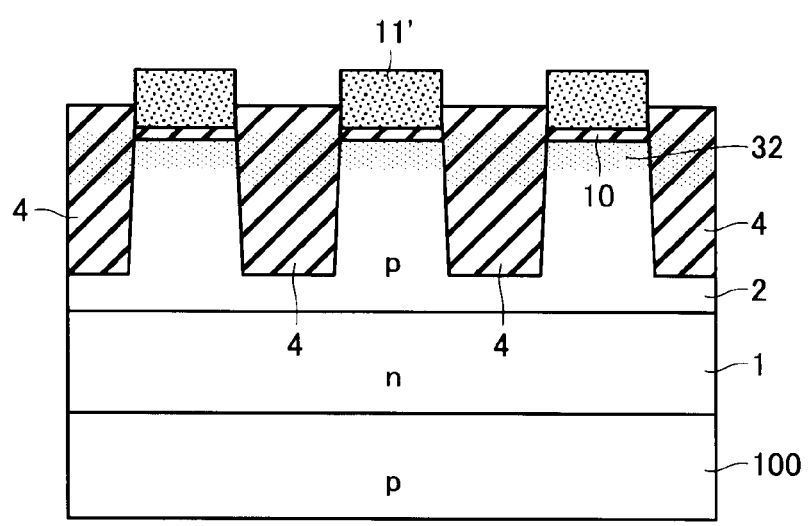

Referring now to FIGS. 15 and 16, a variation of the second embodiment of the present invention will be described below. The configuration and manufacturing method of the memory cell array part are the same as those described in the first embodiment (FIGS. 1 to 9), and so not described in detail in the variation of the second embodiment. This variation is only different from the second embodiment in the configuration of high-voltage n-type MOS transistors among the transistors included in the peripheral circuits (such as row decoders) positioned on the periphery of the memory cell array.

As illustrated in FIG. 15, each high-voltage n-type MOS transistor according to this embodiment has a gate electrode 11d that is disposed on a p-type well 2d on the p-type silicon substrate 100 via a gate insulation film 10d. In addition, the p-type wells 2d (peripheral device regions) disposed high-voltage n-type MOS transistors are insulated and isolated by device isolation/insulation films 4d. In this case, each gate insulation film 10d has a film thickness larger than that of the tunnel insulation film 10. This is because a high voltage (about 20V) is applied to the gate electrodes of the high-voltage n-type MOS transistors.

In addition, the top surface of the device isolation/insulation film 4d is located at a position lower than the top surface of the gate electrode 11d. The position of the top surface of the device isolation/insulation film 4d may be adjusted in a similar way to that described in relation to the device isolation/insulation films 4 in the first embodiment.

In case of the side-surface diffusion implantation should not be performed on other transistors included in the peripheral circuits (such as low-voltage p-type MOS transistors, or high-voltage p-type transistors having gate insulation films with substantially the same film thickness as the gate insulation films 10d). A resist is formed over the surfaces of the other transistors.

P-type impurities (e.g., boron (B)) are implanted into the device isolation/insulation films 4d as in the device isolation/insulation films 4 in the memory cell array, and then diffused into the p-type wells 2d, including the channel parts of high-voltage n-type MOS transistors, through a thermal process. Additionally, in the high-voltage n-type MOS transistors, the device isolation/insulation films 4d have a higher p-type impurity concentration than that of the p-type wells 2d. Thus, it is possible to prevent flowing out the p-type impurities that has once been diffused to the p-type wells 2c because of segregation and so on. Therefore, this embodiment may improve the electrical properties of the high-voltage n-type MOS transistors in the peripheral circuits. This may prevent the occurrence of any bump (KINK) in the drain current when gradually applying voltage to the gate electrodes. Note that the high-voltage n-type MOS transistors included in the peripheral circuits are larger in size than the memory transistors in the memory cell array. Accordingly, although the p-type impurities are diffused in the p-type wells 2d of the high-voltage n-type MOS transistors, they are diffused as illustrated in FIG. 16, not across the entire channel parts, but only to the end portions of the channel parts, i.e., device formation regions in contact with the device isolation/insulation films 4d.

As can be seen, in this embodiment, the p-type impurities are also implanted into the device isolation/insulation films 4d that insulate and isolate the high-voltage n-type MOS transistors in the peripheral circuit area, and then diffused into the channel parts of the high-voltage n-type MOS transistors. Since the top surfaces of the device isolation/insulation films 4d are lowered below the top surfaces of the gate electrodes 11d through the etch-back process, the p-type impurities may be implanted into their channel parts as in the memory cells MC.

In addition, it is possible to increase impurity concentration of the end portions of the channel region that contact the device isolation/insulation films 4d, i.e., the impurity concentration of the channel region below the end portions of the gate electrode 11d in the channel width direction. This may prevent the occurrence of any bump (KINK) in the drain current when gradually applying voltage to the gate electrodes.

While embodiments of the present invention have been described, the present invention is not intended to be limited to the disclosed embodiments, and various other changes, additions or the like may be made thereto without departing from the spirit of the invention.

What is claimed is:

1. A semiconductor storage device comprising:
a semiconductor substrate;
a semiconductor layer formed on the semiconductor substrate;
a first device isolation/insulation film formed in a trench, the trench formed in the semiconductor layer such that the trench has a longitudinal direction parallel with a first direction;
a device formation region formed by separating the semiconductor layer by the first device isolation/insulation film such that the device formation region has a longitudinal direction parallel with the first direction; and
a memory transistor disposed on the device formation region,
the first device isolation/insulation film and the device formation region having an impurity of a first conductivity type, and
an impurity concentration of the impurity of the first conductivity type in the first device isolation/insulation film being higher than that in the device formation region.

2. The semiconductor storage device according to claim 1, wherein
the device formation region has a substantially uniform impurity concentration distribution along the first direction.

3. The semiconductor storage device according to claim 2, wherein
the device formation region includes a NAND string formed therein, the NAND string comprising a plurality of the memory transistors connected in series along the first direction, and selection gate transistors are formed at both ends of the NAND string to select the NAND string, and
the device formation region has a substantially uniform impurity concentration distribution, in a position at which the selection gate transistors are disposed, along the first direction.

4. The semiconductor storage device according to claim 1, wherein
the memory transistor comprises:
a tunnel insulation film in contact with a top surface of the device formation region;
a floating gate in contact with a top surface of the tunnel insulation film;
a first gate insulation film in contact with a top surface of the floating gate;
a control gate in contact with a top surface of the first gate insulation film; and
a diffusion layer of a second conductivity type functioning as a source and a drain of the memory transistor, and
a top surface of the first device isolation/insulation film is located below a top surface of the floating gate.

5. The semiconductor storage device according to claim 4, wherein
the memory transistor is positioned in a first area, and
a peripheral circuit is further positioned in a second area on the periphery of the first area.

6. The semiconductor storage device according to claim 5, wherein
a boundary between the first area and the second area is located at the first device isolation/insulation film, and
an impurity concentration of the impurity of the first conductivity type in the device formation region located in the first area is higher than that in the device formation region located in the second area.

7. The semiconductor storage device according to claim 5, wherein
a boundary between the first area and the second area is located at the device formation region,
an impurity concentration of the impurity of the first conductivity type in the device formation region located on the boundary is higher than that in the device formation region located in the second area, and
an impurity concentration of the impurity of the first conductivity type in the device formation region located on the boundary is lower than that in the device formation region located in the first area.

8. The semiconductor storage device according to claim 5, further comprising:
a MOS transistor of a second conductivity type as a type opposite to the first conductivity type included in the peripheral circuit; and
a second device isolation/insulation film insulated and isolated peripheral device regions where the MOS transistors of the second conductivity type are formed,
wherein the peripheral device region is insulated and isolated by the second device isolation/insulation film, and
an impurity concentration of the impurity of the first conductivity type in the second device isolation/insulation film is higher than that in the peripheral device region.

9. The semiconductor storage device according to claim 8, wherein
the MOS transistor of the second conductivity type comprises:
a second gate insulation film in contact with a top surface of the peripheral device region; and
a gate electrode in contact with a top surface of the second gate insulation film, and the impurity of the first conductivity type is diffused into a top surface of the semiconductor layer located below the gate electrode.

10. The semiconductor storage device according to claim 9, wherein
the second gate insulation film has substantially the same film thickness as that of the tunnel insulation film.

11. The semiconductor storage device according to claim 9, wherein
the second gate insulation film has a film thickness larger than that of the tunnel insulation film.

12. The semiconductor storage device according to claim 9, wherein
a top surface of the second device isolation/insulation film is located below a top surface of the gate electrode.

* * * * *